United States Patent
De Vries et al.

(10) Patent No.: US 8,794,022 B2
(45) Date of Patent: *Aug. 5, 2014

(54) SYSTEMS AND METHODS FOR PROVIDING AIR CONDITIONING TO AN ELECTRONIC COMPONENT IN A SATELLITE ANTENNA INSTALLATION

(75) Inventors: James David De Vries, Gilbert, AZ (US); Kyle Duane Rachal, Mesa, AZ (US)

(73) Assignee: EchoStar Technologies, L.L.C., Englewood, CO (US)

( * ) Notice: Subject to any disclaimer, the term of this patent is extended or adjusted under 35 U.S.C. 154(b) by 12 days.

This patent is subject to a terminal disclaimer.

(21) Appl. No.: 13/240,934

(22) Filed: Sep. 22, 2011

(65) Prior Publication Data

US 2012/0006508 A1 Jan. 12, 2012

Related U.S. Application Data

(63) Continuation of application No. 12/618,438, filed on Nov. 13, 2009, now Pat. No. 8,042,351.

(51) Int. Cl.
*F25D 23/12* (2006.01)

(52) U.S. Cl.
USPC .......................................... 62/259.2; 62/448

(58) Field of Classification Search
CPC ........ G06F 1/20; H01L 23/427; H01L 23/473
USPC ................ 62/259.2, 187, 419, 448; 165/80.3, 165/104.33, 96; 454/74, 184, 237; 361/274, 361/678
See application file for complete search history.

(56) References Cited

U.S. PATENT DOCUMENTS

| | | | |
|---|---|---|---|
| 4,433,337 A | | 2/1984 | Smith et al. |
| 4,480,677 A | * | 11/1984 | Henson et al. ................. 164/46 |
| 4,720,983 A | * | 1/1988 | Mintz .......................... 62/259.1 |
| 4,748,451 A | * | 5/1988 | Edwards ........................ 343/880 |
| 4,920,350 A | | 4/1990 | McGuire et al. |
| 5,712,849 A | * | 1/1998 | Makowski ..................... 370/310 |
| 6,198,457 B1 | | 3/2001 | Walker et al. |
| 6,212,404 B1 | * | 4/2001 | Hershtig ........................ 455/561 |
| 6,276,159 B1 | | 8/2001 | Pfister et al. |
| 6,430,943 B2 | | 8/2002 | Pfister et al. |
| 6,490,878 B1 | * | 12/2002 | Luminet et al. ................. 62/256 |
| 6,546,646 B1 | | 4/2003 | Thomas |
| 6,870,819 B1 | | 3/2005 | Potier |
| 6,918,254 B2 | * | 7/2005 | Baker ............................. 60/653 |

(Continued)

OTHER PUBLICATIONS

General Dynamics SATCOM Technologies "Model 9.3m Compact Cassegrain Antenna," Jun. 2008, 2 pages.

(Continued)

*Primary Examiner* — Mohammad M Ali
(74) *Attorney, Agent, or Firm* — Ingrassia Fisher & Lorenz, P.C.

(57) ABSTRACT

An air conditioning system provides air to an enclosure associated with a satellite antenna that houses an amplifier or other electronic component. The air conditioning system supplies conditioned air to the bottom of the enclosure and receives return air from the top of the enclosure for improved airflow. Various implementations may also provide redundancy through the use of common supply and return plenums, or other features. In some embodiments, the air conditioning system may be conveniently retrofit onto existing satellite antenna installations to provide improved efficiency and redundancy.

20 Claims, 3 Drawing Sheets

(56) References Cited

U.S. PATENT DOCUMENTS

Figure 1:
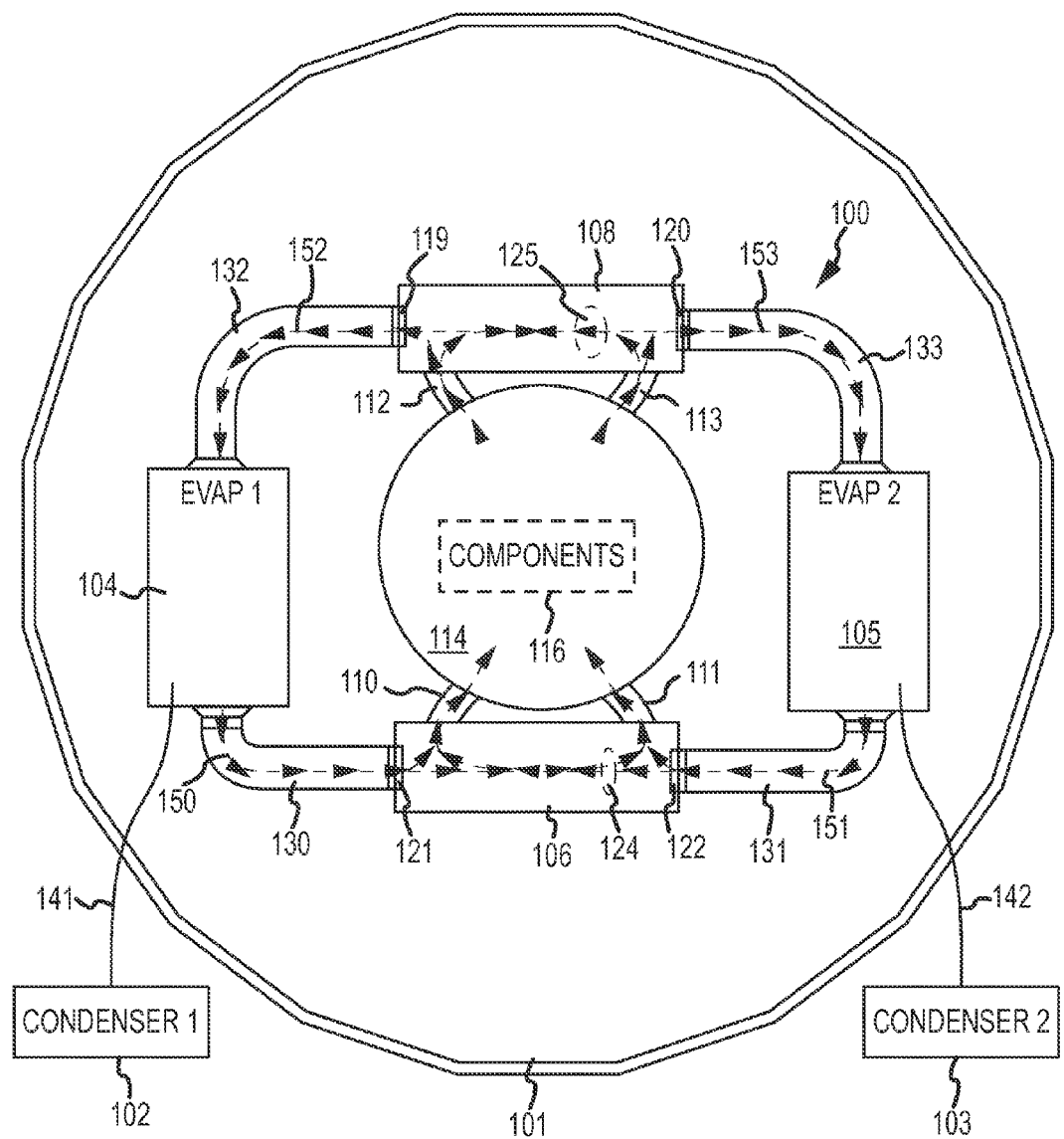

| | | |
|---|---|---|
| 7,061,446 B1 | 6/2006 | Short, Jr. et al. |
| 7,138,957 B1 | 11/2006 | Bruchie |
| 7,268,744 B1 | 9/2007 | Short, Jr. et al. |
| 7,771,564 B2 | 8/2010 | Yokogawa et al. |
| 8,336,322 B2 * | 12/2012 | Cur et al. ............ 62/185 |
| 2007/0259618 A1 | 11/2007 | Nomine-Begiun |
| 2008/0156028 A1 | 7/2008 | Cur et al. |
| 2008/0156030 A1 | 7/2008 | Cur et al. |
| 2008/0156031 A1 | 7/2008 | Cur et al. |
| 2008/0156032 A1 | 7/2008 | Cur et al. |
| 2008/0156033 A1 | 7/2008 | Cur et al. |
| 2008/0156034 A1 | 7/2008 | Cur et al. |
| 2008/0258988 A1 | 10/2008 | Son et al. |
| 2011/0113815 A1 | 5/2011 | De Vries et al. |

OTHER PUBLICATIONS

General Dynamics SATCOM Technologies "Model 13.1m Cassegrain Antenna," Jun. 2008, 2 pages.

Author Unknown, Images of 9m antenna with top-feeding air conditioning system installed prior to Nov. 13, 2009.

USPTO "Non-Final Office Action" mailed Nov. 9, 2010; U.S. Appl. No. 12/618,438, filed Nov. 13, 2009.

USPTO "Final Office Action" mailed Mar. 30, 2011; U.S. Appl. No. 12/618,438, filed Nov. 13, 2009.

USPTO "Notice of Allowance" mailed Jul. 28, 2011; U.S. Appl. No. 12/618,438, filed Nov. 13, 2009.

* cited by examiner

SYSTEMS AND METHODS FOR PROVIDING AIR CONDITIONING TO AN ELECTRONIC COMPONENT IN A SATELLITE ANTENNA INSTALLATION

CROSS-REFERENCES TO RELATED APPLICATIONS

This application is a continuation of and claims priority to U.S. Non-Provisional application Ser. No. 12/618,438, filed Nov. 13, 2009.

TECHNICAL FIELD

The present disclosure generally relates to satellite antennas. In particular, the following discussion relates to improved systems and techniques for providing air conditioning to electronic components found in an enclosure attached to a satellite antenna.

BACKGROUND

Satellites are commonly used for many different types of communication. Direct broadcast satellite (DBS) operators, for example, commonly use satellites to broadcast television, data and/or other signals to subscribers across a relatively wide geographic region. DBS operators (as well as other satellite operators) typically use somewhat large antennas (e.g., on the order of 5-15 meters or so in diameter) to transmit and receive signals between satellites in orbit and ground stations located on the Earth.

Traditionally, signals transmitted to a satellite were generated at a transmitter, amplified at a suitable amplifier, and then relayed to an antenna that may be located tens or hundreds of meters from the amplifier. Transmitting the amplified signal to the antenna often presented issues in terms of cabling, noise avoidance and the like due to the high power nature of the amplified signal being transmitted. As amplifiers have become smaller and more rugged in recent years, however, amplifiers can now be located in a rear hub or other enclosure that is located directly on or near the antenna, thereby reducing or eliminating the need to conduct the high-power amplified signal for relatively long distances.

Locating amplifiers and other electronic components, circuits and/or other equipment at the antenna itself can present additional issues. In particular, many types of electronic equipment are sensitive to heat, such as heat generated by the amplifiers themselves, or by ambient conditions. In practice, many air conditioning systems that have been provided for use with antenna installations have proven to be inadequate for various reasons.

As a result, it is now desirable to create systems and methods for air conditioning of electronic components located on or near a satellite antenna. Other desirable features and characteristics may also become apparent from the subsequent detailed description and the appended claims, taken in conjunction with the accompanying drawings and this background section.

BRIEF SUMMARY

According to various exemplary embodiments, systems and methods are described for supplying conditioned air to an enclosure associated with a satellite antenna that houses an amplifier or other electronic component. The air conditioning system provides an supply of conditioned air to the bottom of the enclosure and receives return air from the top of the enclosure for improved airflow. Various implementations may also provide redundancy through the use of common supply and return plenums, or other features. In some embodiments, the air conditioning system may be conveniently retrofitted onto existing satellite antenna installations to provide improved efficiency and redundancy.

In an exemplary embodiment, a system comprises a satellite antenna configured to transmit a signal to a satellite, an enclosure attached to the satellite antenna that houses an amplifier configured to amplify the signal transmitted by the satellite antenna, and an air conditioning system. The air conditioning system is coupled to the bottom of the enclosure and to the top of the enclosure, and is configured to supply conditioned air to the bottom of the enclosure and to the receive return air from the top of the enclosure.

Other embodiments provide a system to provide air to an enclosure attached to a satellite antenna. The system comprises a first evaporator and a second evaporator, a common supply plenum coupled to receive conditioned air from at least one of the first and second evaporators and to supply the conditioned air to a bottom portion of the enclosure, and a common return plenum coupled to receive return air from a top portion of the enclosure and to return the air to the at least one of the first and second evaporators.

Still other embodiments provide a method performed by an air conditioning system to provide conditioned air to an enclosure attached to a satellite antenna, wherein the enclosure comprises a top portion and a bottom portion. The method comprises the functions of providing conditioned air from either of a first evaporator and a second evaporator to the bottom portion of the enclosure via a common supply plenum, receiving return air from the top portion of the enclosure at a common return plenum, and returning the return air from the common return plenum to either or both of the first and second evaporators.

Various other embodiments, aspects and features are described in more detail below.

BRIEF DESCRIPTION OF THE DRAWING FIGURES

Figure 2:
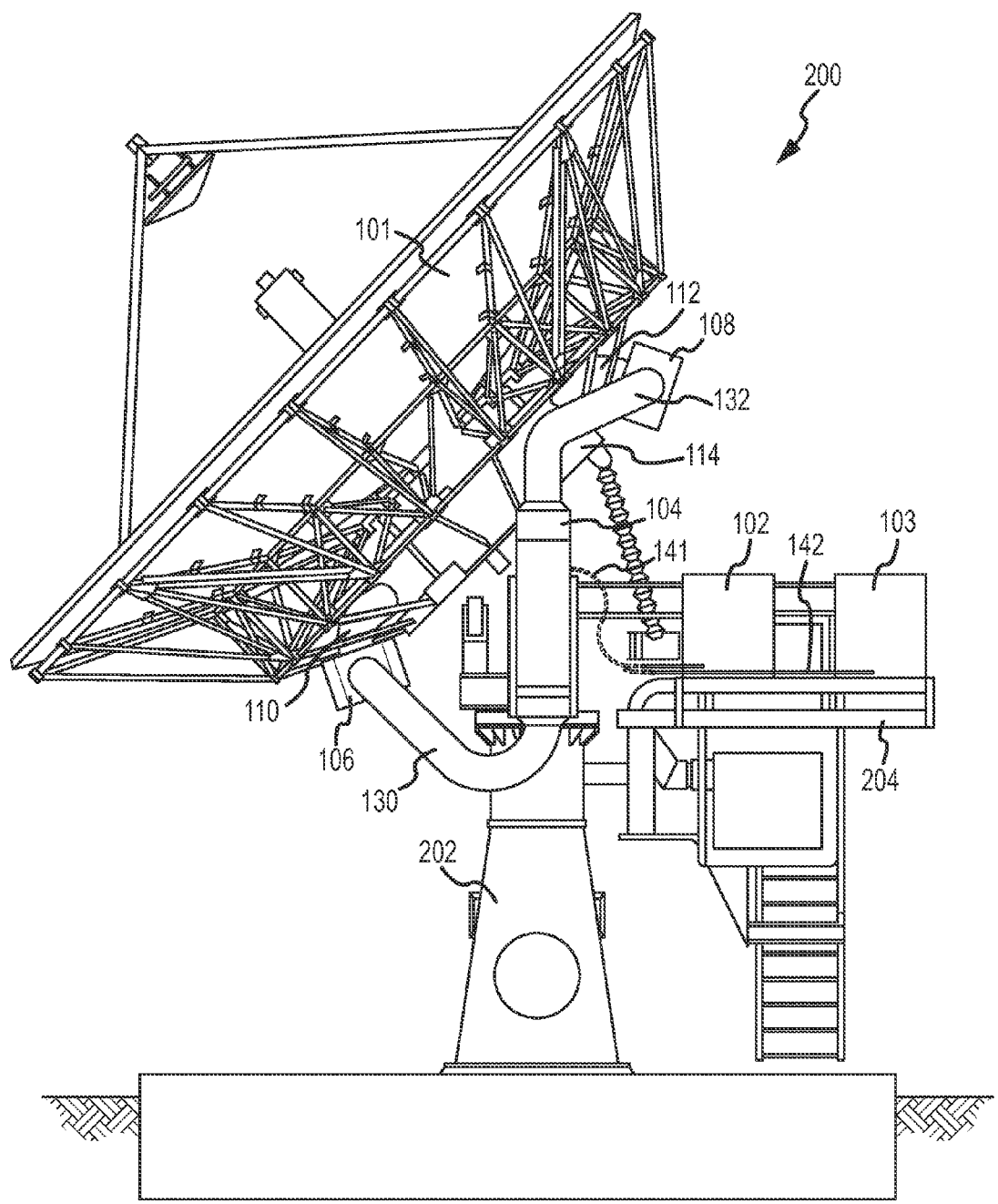
Figure 3:
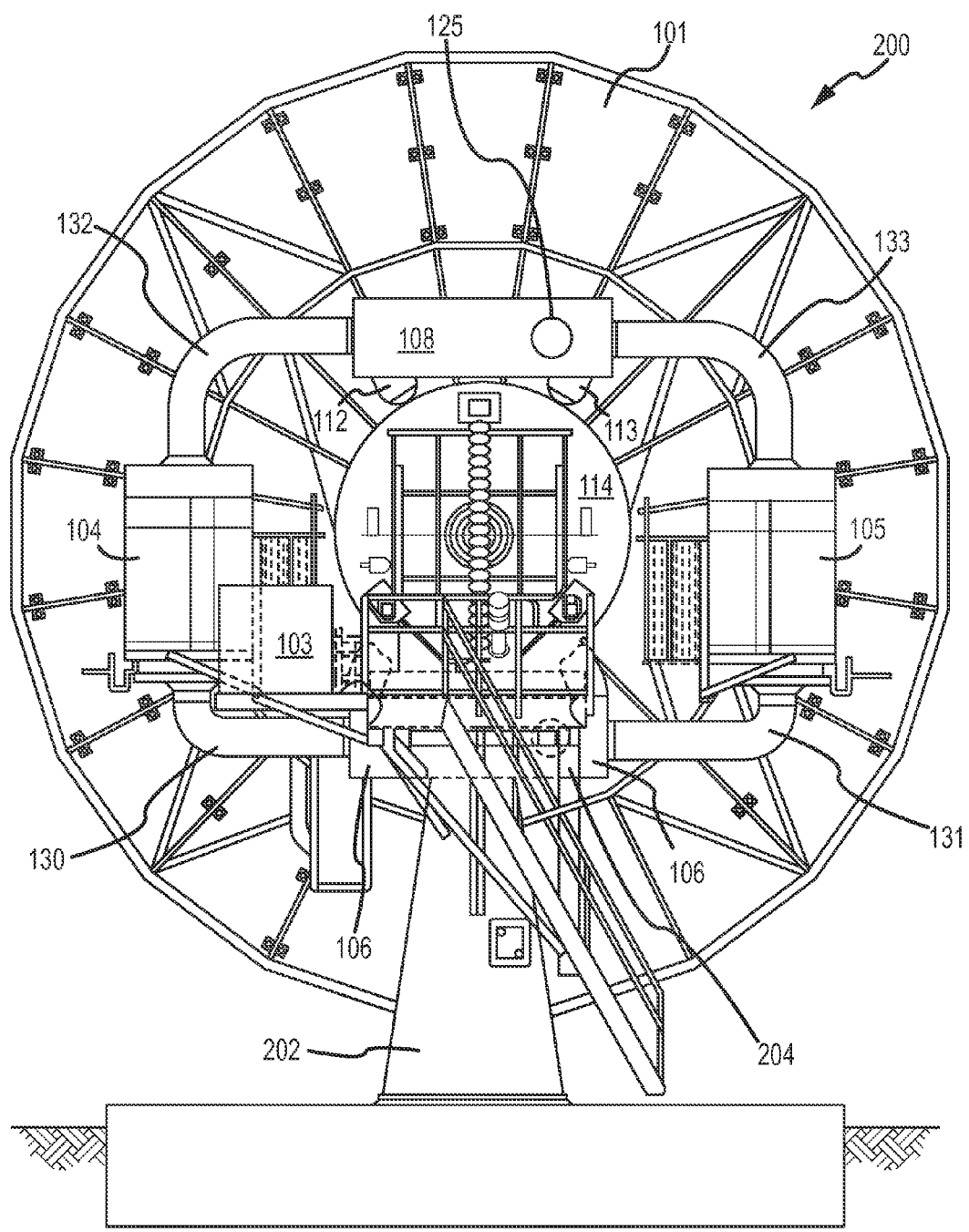

Exemplary embodiments will hereinafter be described in conjunction with the following drawing figures, wherein like numerals denote like elements, and FIG. 1 is a diagram showing various components of an exemplary air conditioning system as well as exemplary airflows through the system;

FIG. 2 is a side view showing an exemplary air conditioning system attached to a satellite antenna; and FIG. 3 is a rear view of the exemplary air conditioning system shown in FIG. 2.

DETAILED DESCRIPTION

The following detailed description of the invention is merely exemplary in nature and is not intended to limit the invention or the application and uses of the invention. Furthermore, there is no intention to be bound by any theory presented in the preceding background or the following detailed description.

According to various exemplary embodiments, an air conditioning system for a satellite antenna provides improved cooling to amplifiers or other electronic components, and also provides improved redundancy to reduce the risk of overheating or other issues. In various embodiments, a bottom-supply, top-return system is provided that facilitates efficient flow of conditioned air from one or more evaporators through a hub or other enclosure that houses the electronic components. Common supply and return plenums or other features can also be provided to improve redundancy, and to provide efficient airflow using either of a pair of redundant evaporators. Various embodiments may also provide access ports in the common plenums or elsewhere to facilitate connections to an external evaporator, thereby providing even more redundancy. Several different features that provide improved airflow, redundancy and/or efficiency are described below; any number of these features may be used or not used in various different embodiments.

Turning now to the drawing figures and with initial reference to FIG. 1, an exemplary air conditioning system 100 provides relatively cool air to a hub or other enclosure 114 associated with a satellite antenna 101. Air conditioning system 100 suitably maintains components 116 located within enclosure 114 at a desired operating temperature by efficiently providing cool air in a reliable, redundant manner.

Enclosure 114 is any sort of hub, compartment or other enclosed space capable of housing one or more amplifiers, circuits or other components 116. In various embodiments, enclosure 114 is a conventional hub provided with and attached to antenna 101 that houses one or more amplifiers. These amplifiers generally receive and amplify the signals that are transmitted to one or more satellites using antenna 101. By locating the amplifiers and/or other component(s) 116 within enclosure 114 on antenna 101, previous issues associated with relaying the amplified signals from a building or other location apart from antenna 101 can be avoided. The heat generated by operating components 116 within the enclosure 114, however, coupled with any ambient heat from the outdoor environment typically surrounding antenna 101, can create issues if any components 116 become overheated.

Air conditioning system 100 therefore provides cooled air in an efficient manner to enclosure 114 so that components 116 remain at an appropriate operating temperature. System 100 may also provide several levels of redundancy, as appropriate. As shown in FIG. 1, an exemplary system 100 suitably includes a first evaporator 104 and a second evaporator 105 that interact with a first condenser 102 and a second condenser 103, respectively, to produce cooled air using conventional techniques. The cooled air produced by evaporator 104 and/or evaporator 105 is supplied to the bottom of enclosure 114, as appropriate, and collected from the top of enclosure 114 to facilitate efficient airflow. Because warmer air naturally rises above the cooler, heavier air that is supplied at the bottom, the bottom-feeding design shown in FIG. 1 can provide a more efficient airflow than conventional top-supplying designs.

Air may be supplied and returned in any manner. In the exemplary embodiment shown in FIG. 1, air from evaporator 104 and/or evaporator 105 is supplied through ducts 130 and 131, respectively, to a common supply plenum 106 that provides cooled air to enclosure 114 via nozzles 110 and 111. Similarly, air from enclosure 114 is provided through nozzles 112 and 113 to a common return plenum 108. Return plenum 108 is shown connected to evaporators 104 and 105 via ducts 132 and 133, respectively. While other embodiments may use different structures to deliver air to enclosure 114 and/or to return air to evaporator 104 and/or evaporator 105, the use of common plenums 106 and 108 facilitates redundancy, as described more fully below, and also promotes efficient flow of air from either evaporator 104 and/or evaporator 105 through enclosure 114.

Evaporators 104 and 105 are any conventional HVAC evaporator or air handler units capable of producing cool air in system 100. Typically, evaporators 104 and 105 contain hoses or other conduits 141 and 142 for receiving compressed coolant from condensers 102 and 103, respectively, and for returning expanded coolant to the condensers as appropriate. Such conduits 141 and 142 may be flexible in some embodiments to facilitate movement of evaporators 104 and 105 with respect to condensers 102 and 103 as antenna 101 tilts and rotates, as described more fully below.

Generally speaking, it is desirable that condensers 102 and 103 provide sufficient refrigerant sub-cooling capacity to support effective cooling of enclosure 114. In one embodiment, condensers 102 and 103 are each relatively high efficiency units, such as 7.5 ton units or so, although other embodiments may use condensers 102 and 103 with more or less capacity, depending upon the size and makeup of enclosure 114, the climate in which antenna 101 is deployed, the amount of heat produced by components 116, and/or any number of other factors. One example of a condensing unit that could be used in an exemplary embodiment is the 7.5 ton TRANE model TTA090D3HR-0 condensing unit, although other embodiments could use any other products available from many different manufacturers. It is not necessary that condensers 102 and 103 be identical to each other, although they may be similar or identical in many implementations.

Evaporators 104 and 105 may also be implemented with identical or non-identical evaporating units. The TRANE model 4TEC3F4881000 air handler, for example, could be used in at least one embodiment, although other embodiments could use any other products, including any sort of evaporator or air handler from any other supplier. In various embodiments, evaporators 104 and 105 may incorporate high static fans or other features for efficiently moving air through system 100, although other embodiments may incorporate additional or alternate fans or other air moving features elsewhere in system 100.

Supply plenum 106, return plenum 108 and ducts 130-133 may be formed of aluminum, other metal, composite material or any other appropriate material as desired. In the illustrated embodiment, supply plenum 106 and return plenum 108 are each formed to be about 20 inches by about 13 feet (approximately 51×396 cm) or so, and ducts 130-133 may be about 20 inches (approximately 51 cm) in diameter. Other embodiments, however, could support any number of other shapes, materials and/or dimensions other than those described herein.

Supply plenum 106 and return plenum 108 facilitate redundant operation by allowing air from either evaporator 104, 106 to supply cool air to enclosure 114. In the exemplary embodiment shown in FIG. 1, for example, supply plenum 106 supplies cool air to enclosure 114 via nozzles 110 and 111. Return plenum 108 similarly receives air from enclosure 114 via nozzles 112 and 113. During normal operation of many embodiments, either evaporator 104 or evaporator 105 (operating in conjunction with condenser 102 or condenser 103, respectively) is able to supply sufficient conditioned air to enclosure 114 to maintain components 116 at an appropriate temperature.

While some embodiments may allow simultaneous operation of evaporators 104 and 105 if additional cooling is needed or desired, many implementations may designate one evaporator 104 or 105 as a primary unit (with the other evaporator 104 or 105 being designated as a secondary unit), or the two units 104 and 105 may be separately operated to provide redundant backup to each other in any manner. While one of the evaporators 104, 105 is operational, supply plenum 106 delivers conditioned air from the operating unit to both nozzles 110 and 111. Return plenum 108 similarly provides return air from both nozzles 112 and 113 to the working evaporator 104, 105, as appropriate. While simultaneous operation of both evaporator 104 and 105 may be supported in some embodiments, the use of common plenums 106, 108 provides efficient delivery of conditioned air to enclosure 114 using only one evaporator 104, 105, as desired.

In various embodiments, supply plenum 106 and return plenum 108 each incorporate barometric or other dampers 119-122 that can further prevent undesired airflows and improve redundant operation when one or more evaporators 104, 105 is not operating. While evaporator 104 is inoperational (e.g., due to operation of evaporator 105), for example, damper 121 in supply plenum 106 and damper 119 in return plenum 108 could close, thereby preventing significant airflow to or from the evaporator 104. Air from evaporator 105 would nevertheless flow into supply plenum 106, through nozzles 110 and 111 to enclosure 114, out nozzles 112 and 113 to return plenum 108, and back to evaporator 105. Similarly, while evaporator 105 is inoperational, dampers 120 and 122 could be closed to allow evaporator 104 to continue operation without significant leakage of air into the inoperative evaporator 105. Hence, the use of common supply and return plenums 106 and 108 facilitates redundant operation, particularly when barometric dampers 119-122 are also provided.

Further redundancy could be provided in some implementations by providing access ports 124 and 125 in supply plenum 106 and return plenum 108, respectively. These access ports 124, 125 could allow connections to an external evaporator or other source of cool air, such as a portable air conditioning unit. In such embodiments, port 124 would typically be connected to the supply port of the external source, with port 125 being connected to the return line of the external source. Because plenums 106 and 108 provide access to all of the supply and return nozzles 110-113 in FIG. 1, ports 124 and 125 would provide a common source for externally-conditioned and return air (respectively) that could nevertheless be expected to provide effective cooling to enclosure 114. Hence, the use of common plenums 106, 108 including the various features shown in FIG. 1 provides a form of "triple redundancy" in the sense that evaporator 104, evaporator 105 and/or an external source of air could be used to effectively cool enclosure 114 as desired.

In operation, then, system 100 is able to provide conditioned air to enclosure 114 and to maintain components 116 at or near a desired operating temperature. Evaporators 104 and 105 suitably interact (via couplings 141 and 142, respectively) with condensers 102, 103 produce relatively cool air represented by airflows 150 and 151 in ducts 130 and 131, respectively. This conditioned air 150, 151 is provided to a common supply plenum 106 that allows conditioned air 150, 151 from either evaporator 104, 105 to enter the bottom of enclosure 114. Return air emanating from the top of enclosure 114 into common receive plenum 108 is appropriately received and returned toward evaporator 104 (e.g., return air 152 in duct 132) and/or evaporator 105 (e.g., return air 153 in duct 133) as appropriate. In the event that either or both evaporators 104, 105 become inoperative, airflows 150-153 to and from the inactive evaporators 104-105 may be prevented through the use of barometric dampers 119-122, as desired. Further, air may be received in plenum 106 from an external source via port 124 and/or returned to the external source from plenum 108 via port 125, as desired. Additional or alternate functions may be provided in any number of equivalent embodiments.

FIGS. 2 and 3 show side and rear views, respectively, of an exemplary antenna system 200 that has been installed on an antenna 101 that includes a hub or other enclosure 114 that houses one or more amplifiers 116 and/or other components. As noted above, the air conditioning system may be installed on or near antenna 101 in any manner. In various embodiments, evaporators 104 and 105, plenums 106 and 108 and ducts 13-133 are rigidly connected to each other and are rigidly fixed to antenna 101 to permit orientation, aiming, servicing and/or other movement of antenna 101. In various embodiments, condensers 102 and 103 are not rigidly fixed to evaporators 104, 105 or other components of system 100 to permit more efficient movement. In the embodiment shown in FIGS. 2-3, for example, condensers 102 and 103 are supported on a platform 204 that remains rigid with respect to a pedestal 202 or other support for antenna 101, but that does not necessarily rotate, translate or otherwise move with respect to antenna 101. Flexible couplings 141 and 142 (as well as any power couplings to evaporators 104, 105 or other components of system 100) can facilitate such movement without unduly complicating the mechanical design and implementation of system 200.

Some antenna systems 200 may be designed and delivered to incorporate bottom feeding of conditioned air and/or to support the redundancy features described herein. In various other embodiments, a redundant, bottom-feeding air conditioning system such as system 100 may be retrofitted to a satellite antenna 101 that may not have been originally provided without an air conditioning system, or that may have been provided with a less suitable system. In various embodiments, an antenna 101 may be provided by a manufacturer with a hub enclosure 114 that includes nozzles 110-113. Such nozzles may have been intended, however, for use in a scheme that supplies air from one evaporator to nozzle 112 and that returns air to that evaporator from nozzle 110, and that supplies air from a second evaporator to nozzle 113, with return air being provided from nozzle 111. While this scheme would exhibit the marked disadvantages of a top-supplying airflow and the lack of true redundancy without plenums 106 and 108, it may nevertheless be convenient to install system 100 using the same nozzles 110-113 that are provided by the manufacturer. The flexible design afforded by the common plenums 106, 108 could allow for connection to any number of different manufacturers' designs, even after the antenna 101 has been installed.

Various systems and processes for efficiently and reliably air conditioning a hub or other enclosure 114 associated with a satellite antenna 101 have been described. The various benefits available from different embodiments could include bottom-supply-top-return of air to take advantage of efficient airflow through the cooled enclosure 114. Other embodiments may additionally or alternately incorporate common supply and/or return plenums 106, 108 for improved delivery of cool air, as well as better redundancy. Other embodiments may provide alternate or additional features as well as those described herein.

While several exemplary embodiments have been presented in the foregoing detailed description, it should be appreciated that a vast number of alternate but equivalent variations exist, and the examples presented herein are not intended to limit the scope, applicability, or configuration of the invention in any way. To the contrary, various changes may be made in the function and arrangement of elements described without departing from the scope of the claims and their legal equivalents. The term "exemplary" is used herein to represent one example, instance or illustration that may have any number of alternates. Any implementation described herein as "exemplary" is not necessarily to be construed as preferred or advantageous over other implementations.

What is claimed is:

1. A system comprising:
   a satellite antenna configured to transmit a signal to a satellite that orbits the earth;
   an enclosure attached to the satellite antenna and having a top and a bottom;
   an amplifier disposed in the enclosure, wherein the amplifier is configured to amplify the signal transmitted by the satellite antenna; and
   an air conditioning system coupled to the bottom of the enclosure and to the top of the enclosure, wherein the air conditioning system is configured to supply conditioned air to the bottom of the enclosure and to receive return air from the top of the enclosure.

2. The system of claim 1 wherein the air conditioning system comprises a first evaporator and a second evaporator and a common supply plenum coupled to the bottom of the enclosure, wherein the common supply plenum is configured to receive the conditioned air from at least one of the first and second evaporators and to provide the conditioned air to the bottom of the enclosure.

3. The system of claim 2 wherein the air conditioning system comprises a first duct coupling the common supply plenum to the first evaporator and a second duct coupling the common supply plenum to the second evaporator.

4. The system of claim 3 wherein the common supply plenum comprises a first damper configured to prevent the conditioned air from entering the first duct and a second damper configured to prevent the conditioned air from entering the second duct.

5. The system of claim 2 wherein the air conditioning system comprises a common return plenum coupled to the top of the enclosure, wherein the common return plenum is configured to receive the return air from the top of the enclosure and to provide the return air to at least one of the first and second evaporators.

6. The system of claim 5 wherein the common supply plenum is coupled to the bottom of the enclosure via at least one first nozzle, and wherein the common return plenum is coupled to the top of the enclosure via at least one second nozzle.

7. The system of claim 5 wherein the air conditioning system comprises a first duct coupling the common supply plenum to the first evaporator, a second duct coupling the common supply plenum to the second evaporator, a third duct coupling the common return plenum to the first evaporator and a fourth duct coupling the common return plenum to the second evaporator.

8. The system of claim 7 wherein the common supply plenum comprises a first damper configured to prevent the conditioned air from entering the first duct and a second damper configured to prevent the conditioned air from entering the second duct, and wherein the common return plenum comprises a third damper configured to prevent the return air from entering the third duct and a fourth damper configured to prevent the return air from entering the fourth duct.

9. The system of claim 5 wherein the common supply plenum comprises a first port configured to receive the conditioned air from an external source, and wherein the common return plenum comprises a second port configured to provide the return air to the external source.

10. The system of claim 2 further comprising first and second condensors disposed on a platform, and a pedestal configured to support the satellite antenna and the platform above the ground.

11. The system of claim 10 wherein the first and second condensers are flexibly coupled to the first and second evaporators, respectfully, to thereby permit motion of the satellite antenna and the first and second evaporators with respect to the pedestal.

12. A system to provide conditioned air to an enclosure attached to a satellite antenna that transmits signals to a satellite that orbits the earth, the system comprising:
   a first evaporator and a second evaporator;
   a common supply plenum coupled to receive the conditioned air from at least one of the first and second evaporators and to supply the conditioned air to a bottom portion of the enclosure; and
   a common return plenum coupled to receive return air from a top portion of the enclosure and to return the return air to the at least one of the first and second evaporators.

13. The system of claim 12 wherein the common supply plenum is coupled to the bottom of the enclosure via a first and a second nozzle, and wherein the common return plenum is coupled to the top of the enclosure via a third and a fourth nozzle.

14. The system of claim 13 further comprising a first duct coupling the first evaporator to the common supply plenum, a second duct coupling the second evaporator to the common supply plenum, a third duct coupling the common return plenum to the first evaporator, and a fourth duct coupling the common return plenum to the second evaporator.

15. The system of claim 14 wherein the common supply plenum comprises a first damper configured to prevent airflow into the first duct and a second damper configured to prevent airflow into the second duct.

16. The system of claim 15 wherein the common return plenum comprises a third damper configured to prevent airflow into the third duct and a fourth damper configured to prevent airflow into the fourth duct.

17. The system of claim 16 wherein the common supply plenum comprises a first port configured to receive the conditioned air from an external source, and wherein the common return plenum comprises a second port configured to provide the return air to the external source.

18. A method to air condition an enclosure attached to a satellite antenna that orbits the earth, wherein the enclosure comprises a top portion and a bottom portion, the method comprising:
   providing conditioned air from either of a first evaporator and a second evaporator to the bottom portion of the enclosure via a common supply plenum;
   receiving return air from the top portion of the enclosure at a common return plenum; and
   returning the return air from the common return plenum to either of the first and second evaporators.

19. The method of claim 18 further preventing airflow to at least one of the first and second evaporators by closing at least one damper in the common supply plenum and at least one damper in the common return plenum.

20. The method of claim 18 further comprising receiving the conditioned air from an external source via a first port in the common supply plenum, and returning the return air to the external source via a second port in the common return plenum.

* * * * *